(12) United States Patent
Xu

(10) Patent No.: US 11,791,625 B2
(45) Date of Patent: Oct. 17, 2023

(54) ELECTROSTATIC PROTECTION CIRCUIT

(71) Applicant: CHANGXIN MEMORY TECHNOLOGIES, INC., Hefei (CN)

(72) Inventor: QiAn Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 82 days.

(21) Appl. No.: 17/375,729

(22) Filed: Jul. 14, 2021

(65) Prior Publication Data

US 2021/0359511 A1 Nov. 18, 2021

Related U.S. Application Data

(63) Continuation of application No. PCT/CN2021/076340, filed on Feb. 9, 2021.

(30) Foreign Application Priority Data

May 12, 2020 (CN) .......................... 202010395921.8

(51) Int. Cl.
*H02H 9/04* (2006.01)
*H01L 27/02* (2006.01)

(52) U.S. Cl.
CPC ......... *H02H 9/046* (2013.01); *H01L 27/0255* (2013.01); *H01L 27/0262* (2013.01); *H01L 27/0288* (2013.01)

(58) Field of Classification Search
CPC . H02H 9/046; H01L 27/0255; H01L 27/0262; H01L 27/0288; H01L 23/60;
(Continued)

(56) References Cited

U.S. PATENT DOCUMENTS 5,289,334 A * 2/1994 Ker ...................... H01L 27/0251
361/111
5,359,211 A * 10/1994 Croft ................... H01L 27/0259
257/362

(Continued)

FOREIGN PATENT DOCUMENTS

CN 1132936 A 10/1996
CN 1571154 A 1/2005
(Continued)

OTHER PUBLICATIONS

International Search Report in Application No. PCT/CN2021/076340, dated Apr. 22, 2021.
(Continued)

*Primary Examiner* — Dharti H Patel
(74) *Attorney, Agent, or Firm* — SYNCODA LLC; Feng Ma

(57) ABSTRACT

The present invention relates to an electrostatic protection circuit for protecting an internal circuit. The electrostatic protection circuit includes: a first circuit connected between a power pad and an input pad and configured to discharge a first electrostatic current; a second circuit connected between the input pad and a ground pad and configured to discharge a second electrostatic current; a third circuit connected between the power pad and the input pad and configured to discharge a third electrostatic current; a fourth circuit connected between the power pad and the ground pad and configured to discharge a fourth electrostatic current; a fifth circuit connected between the input pad and the ground pad and configured to discharge a fifth electrostatic current; and a sixth circuit connected between the ground pad and the power pad and configured to discharge a sixth electrostatic current.

9 Claims, 4 Drawing Sheets

(58) Field of Classification Search
CPC ......... H01L 27/02; H01L 27/04; H01L 29/06; H01L 27/0248; H01L 27/0259; H01L 29/0603; H01L 29/0684
USPC .......................................................... 361/56
See application file for complete search history.

(56) References Cited

U.S. PATENT DOCUMENTS

| | | | | |
|---|---|---|---|---|
| 5,473,169 | A * | 12/1995 | Ker | H01L 27/0259 257/362 |
| 5,541,801 | A * | 7/1996 | Lee | H01L 27/0262 361/111 |
| 5,572,394 | A | 11/1996 | Ker et al. | |
| 6,885,534 | B2 | 4/2005 | Ker | |
| 8,611,058 | B2 * | 12/2013 | Fan | H01L 27/0259 361/118 |
| 9,831,234 | B2 | 11/2017 | Lee | |
| 10,134,722 | B2 * | 11/2018 | Yam | H01L 27/0635 |
| 10,134,724 | B2 | 11/2018 | Lee | |
| 10,446,537 | B2 * | 10/2019 | Boselli | H10B 63/20 |
| 2003/0183879 | A1 | 10/2003 | Wang | |
| 2004/0075964 | A1 | 4/2004 | Ker et al. | |
| 2006/0132996 | A1 * | 6/2006 | Poulton | H01L 27/0255 361/56 |
| 2009/0122452 | A1 * | 5/2009 | Okushima | H01L 27/0262 361/56 |
| 2009/0140370 | A1 * | 6/2009 | Jou | H01L 23/60 257/E29.174 |
| 2010/0264457 | A1 * | 10/2010 | Sorgeloos | H01L 27/0259 257/E27.013 |
| 2012/0099228 | A1 * | 4/2012 | Lin | H01L 23/66 361/56 |
| 2013/0342940 | A1 * | 12/2013 | Taghizadeh Kaschani | H02H 9/046 361/56 |
| 2015/0228770 | A1 * | 8/2015 | Lin | H01L 29/0692 257/173 |
| 2017/0179110 | A1 | 6/2017 | Lee | |
| 2018/0068996 | A1 | 3/2018 | Lee | |
| 2018/0145065 | A1 | 5/2018 | Holland et al. | |
| 2021/0351176 | A1 * | 11/2021 | Xu | H01L 27/0262 |

FOREIGN PATENT DOCUMENTS

| | | | |
|---|---|---|---|
| CN | 102569360 A | 7/2012 | |
| CN | 106898606 A | 6/2017 | |
| CN | 108735733 A | 11/2018 | |
| GB | 2128829 A * | 5/1984 | ......... H01L 27/0248 |

OTHER PUBLICATIONS

Altolaguirre Federico A et al:"Low-Leakage Bidirectional SCR With Symmetrical Trigger Circuit for ESD Protection in 40-nm CMOS Process", IEEE Transactions on Device and Materials Reliability, IEEE Service Center, Piscataway, NJ, US,vol. 16, No. 4, Dec. 1, 2016 (Dec. 1, 2016), pp. 549-555, XP011635615, ISSN: 1530-4388, DOI:10.1109/TDMR.2016.2600276 [retrieved on Dec. 2, 2016] the whole document.

Jian Liu et al: "Design and Analysis of Low-voltage Low-Parasitic ESD Protection for RF ICs in CMOS", IEEE Journal of Solid-State Circuits, IEEE, USA, vol. 46, No. 5, May 1, 2011 (May 1, 2011), pp. 1100-1110, XP011354551, ISSN: 0018-9200, DOI:10.1109/Jssc.2011.2118290the whole document*.

English translation of the Written Opinion of the International Search Authority in the international application No. PCT/CN2021/076340, dated Apr. 22, 2021.

Supplementary European Search Report in the European application No. 21803441.1, dated Nov. 25, 2022.

* cited by examiner

ELECTROSTATIC PROTECTION CIRCUIT

CROSS-REFERENCE TO RELATED APPLICATIONS

This application is a continuation of International Patent Application No.: PCT/CN2021/076340 filed on Feb. 9, 2021, which claims priority to Chinese Patent Application No. 202010395921.8 filed on May 12, 2020. The disclosures of these applications are hereby incorporated by reference in their entirety.

BACKGROUND

With the continuous development of semiconductor manufacturing processes, people's requirement for semiconductor devices is also constantly improving. The devices have constantly shrinking volumes, and accordingly, the semiconductor devices have increasingly shorter channels, increasingly larger junction depths, and increasingly thinner oxide layers. Therefore, the requirement for electrostatic protection capability is also constantly improving.

A dynamic random access memory (DRAM) is a semiconductor device with a fast data access function, and mainly develops toward a faster access speed and a larger data storage quantity. However, existing electrostatic protection circuits cannot meet the requirement for electrostatic protection of a high-speed interface, which operates at a low voltage, of the DRAM and other advanced processes.

SUMMARY

In view of the above, the present application provides an electrostatic protection circuit.

An electrostatic protection circuit for protecting an internal circuit, the electrostatic protection circuit including:

a first circuit connected between a power pad and an input pad and configured to discharge a first electrostatic current, the first electrostatic current flowing from the input pad to the power pad;

a second circuit connected between the input pad and a ground pad and configured to discharge a second electrostatic current, the second electrostatic current flowing from the input pad to the ground pad;

a third circuit connected between the power pad and the input pad and configured to discharge a third electrostatic current, the third electrostatic current flowing from the power pad to the input pad;

a fourth circuit connected between the power pad and the ground pad and configured to discharge a fourth electrostatic current, the fourth electrostatic current flowing from the power pad to the ground pad;

a fifth circuit connected between the input pad and the ground pad and configured to discharge a fifth electrostatic current, the fifth electrostatic current flowing from the ground pad to the input pad; and a sixth circuit connected between the ground pad and the power pad and configured to discharge a sixth electrostatic current, the sixth electrostatic current flowing from the ground pad to the power pad.

Details of one or more embodiments of the present invention are set forth in the following accompanying drawings and descriptions. Other features, objectives and advantages of the present invention become obvious with reference to the specification, the accompanying drawings and the claims.

BRIEF DESCRIPTION OF DRAWINGS

In order to better describe and illustrate embodiments of the present application, reference may be made to one or more accompanying drawings, while the additional details or examples for describing the accompanying drawings should not be regarded as limitations on any one of the invention creations, the embodiments described currently, and the preferred embodiments of the present application.

DESCRIPTION OF EMBODIMENTS

Figure 1:
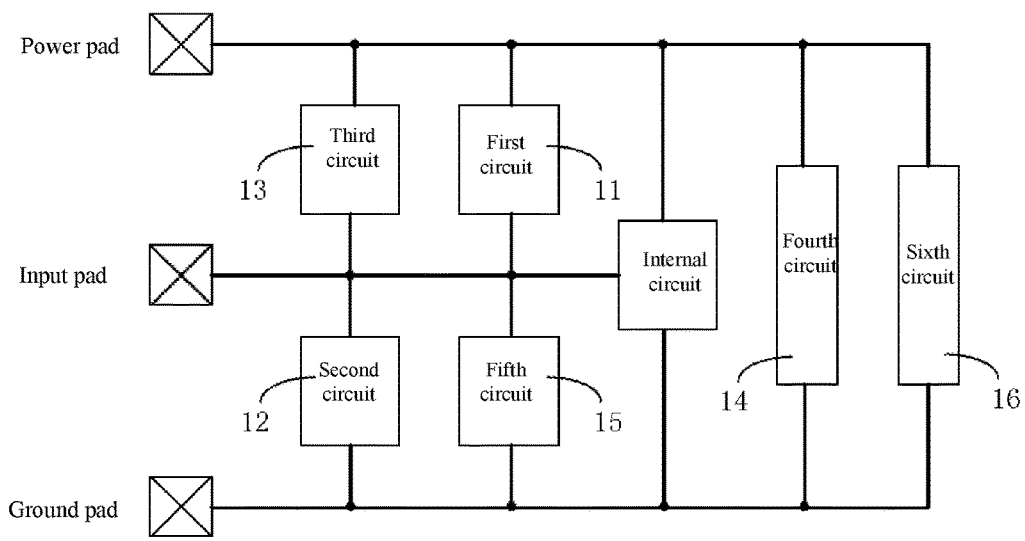
FIG. 1 is a schematic structural diagram of an electrostatic protection circuit according to an embodiment.

In order to easily understand the present application, a more comprehensive description of the present application is given below with reference to the accompanying drawings. Preferred embodiments of the present application are given in the accompanying drawings. However, the present application may be implemented in many different forms and is not limited to the embodiments described herein. On the contrary, these embodiments are provided to understand the disclosed content of the present application more thoroughly and comprehensively.

Unless otherwise defined, all technical and scientific terms used herein have the same meaning as commonly understood by those of ordinary skill in the art to which the present application belongs. The terms used in the specification of the present application are intended only to describe particular embodiments and are not intended to limit the present application.

Spatial relationship terms such as "under", "underneath", "below", "beneath", "over", and "above" may be used for illustrative purposes to describe a relationship between one element or feature and another element or feature illustrated in the drawings. It should be understood that, in addition to the orientations illustrated in the drawings, the spatial relationship terms are intended to further include different orientations of the device in use and operation. For example, if the device in the drawings is flipped, the element or feature described as "below", "underneath" or "under" another element or feature may be oriented as "on" the another element or feature. Thus, the exemplary terms "below" and "under" may include two orientations of above and below. In addition, the device may include additional orientations (e.g., 90-degree rotation or other orientations), and thus spatial descriptors used herein may be interpreted accordingly.

In use, the singular forms of "a", "one", and "/the" may also include plural forms, unless otherwise clearly specified by the context. It should be further understood that the terms "include/comprise" and/or "have" specify the presence of the features, integers, steps, operations, components, portions, or their combinations, but may not exclude the presence or addition of one or more of other features, integers, steps, operations, components, portions, or their combinations. At the same time, in the specification, the term "and/or" includes any and all combinations of one or more of the associated listed items.

Embodiments of the present invention are described herein with reference to cross-sectional views of schematic diagrams of ideal embodiments (and intermediate structures) of the present invention. Correspondingly, illustrated shape variations caused by, for example, manufacturing techniques and/or tolerances, may be expected. Thus, the embodiments of the present invention should not be limited to the specific shapes of the regions illustrated herein, but may include shape deviations caused by, for example, the manufacturing techniques. For example, an implanted region illustrated as a rectangle, typically, has rounded or curved features and/or a gradient of implant concentration at its edges rather than a binary change from an implanted region to a non-implanted region. Likewise, a buried region formed by implantation may result in some implantation in the region between the buried region and a surface through which the implantation takes place. Thus, the region shown in the drawings is essentially schematic, and the illustrated shape is not intended to show the actual shape of the region of the device, and is not intended to limit the scope of the present invention.

FIG. 1 is a schematic structural diagram of an electrostatic protection circuit according to an embodiment. The electrostatic protection circuit is configured to protect an internal circuit. As shown in FIG. 1, in this embodiment, the electrostatic protection circuit includes a first circuit 11, a second circuit 12, a third circuit 13, a fourth circuit 14, a fifth circuit 15 and a sixth circuit 16.

The first circuit 11 is connected between a power pad and an input pad and configured to discharge a first electrostatic current, the first electrostatic current flowing from the input pad to the power pad.

The second circuit 12 is connected between the input pad and a ground pad and configured to discharge a second electrostatic current, the second electrostatic current flowing from the input pad to the ground pad.

The third circuit 13 is connected between the power pad and the input pad and configured to discharge a third electrostatic current, the third electrostatic current flowing from the power pad to the input pad.

The fourth circuit 14 is connected between the power pad and the ground pad and configured to discharge a fourth electrostatic current, the fourth electrostatic current flowing from the power pad to the ground pad.

The fifth circuit 15 is connected between the input pad and the ground pad and configured to discharge a fifth electrostatic current, the fifth electrostatic current flowing from the ground pad to the input pad.

The sixth circuit 16 is connected between the ground pad and the power pad and configured to discharge a sixth electrostatic current, the sixth electrostatic current flowing from the ground pad to the power pad.

In this embodiment, the first circuit 11 to the sixth circuit 16 are respectively configured to discharge an electrostatic current between two pads along a set current flow direction, and when static electricity is in different electrostatic modes, discharge circuits corresponding to different electrostatic currents are turned on. Further, trigger voltages of the first circuit 11, the second circuit 12, the third circuit 13, the fourth circuit 14, the fifth circuit 15 and the sixth circuit 16 according to this embodiment are all lower than a trigger voltage of the internal circuit. Therefore, the electrostatic protection circuit according to this embodiment can quickly discharge the electrostatic current without triggering the internal circuit, which does not affect the normal function of the internal circuit and provides relatively strong electrostatic protection capability.

Figure 2:
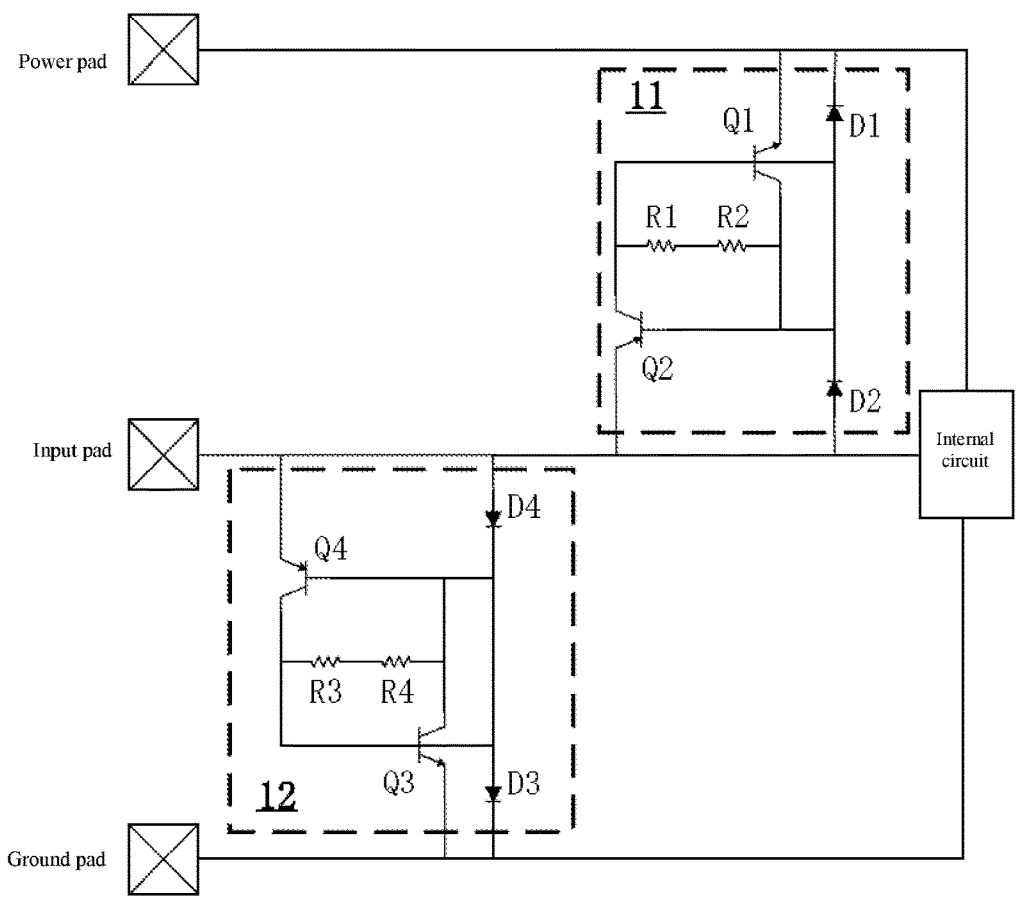
FIG. 2 is a circuit diagram of a protection circuit against static electricity in a PS mode and a PD mode according to an embodiment.

FIG. 2 is a circuit diagram of a protection circuit against static electricity in a PS mode and a PD mode according to an embodiment. As shown in FIG. 2, in this embodiment, the first circuit 11 and the second circuit 12 are configured to protect the internal circuit against static electricity in the PS mode and the PD mode. The PS mode refers to an electrostatic discharge mode in which an electrostatic voltage is positive to a ground voltage, while the PD mode refers to an electrostatic discharge mode in which the electrostatic voltage is positive to a power supply voltage.

The first circuit 11 includes a first NPN transistor Q1 and a first PNP transistor Q2. An emitter of the first NPN transistor Q1 is connected to the power pad, a base of the first NPN transistor Q1 is connected to a collector of the first PNP transistor Q2, a collector of the first NPN transistor Q1 and a base of the first PNP transistor Q2, an emitter of the first PNP transistor Q2 is connected to the input pad, a first diode D1 is connected between the base and the emitter of the first NPN transistor Q1, and a second diode D2 is connected between the emitter and the base of the first PNP transistor Q2. The first diode D1 and the second diode D2 jointly form a diode current path, and the first NPN transistor Q1 and the first PNP transistor Q2 jointly form a silicon controlled rectifier (SCR) current path.

The second circuit 12 includes a second NPN transistor Q3 and a second PNP transistor Q4. An emitter of the second NPN transistor Q3 is connected to the ground pad, a base of the second NPN transistor Q3 is connected to a collector of the second PNP transistor Q4, a collector of the second NPN transistor Q3 and a base of the second PNP transistor Q4, an emitter of the second PNP transistor Q4 is connected to the input pad, a third diode D3 is connected between the base and the emitter of the second NPN transistor Q3, and a fourth diode D4 is connected between the emitter and the base of the second PNP transistor Q4. The third diode D3 and the fourth diode D4 jointly form a diode current path, and the second NPN transistor Q3 and the second PNP transistor Q4 jointly form an SCR current path.

Specifically, when no electro-static discharge (ESD) happens, the power supply voltage is inputted to the power pad, the ground pad is connected to the ground, and the internal circuit operates normally. It may be understood that due to circuit characteristics of a diode structure and an SCR structure, an on-voltage of the diode current path is less than that of the SCR current path. Therefore, when ESD in the PS mode and the PD mode happens, the electrostatic voltage is positive to the power supply voltage or to the ground voltage, and in the circuit structure according to this embodiment, the diode current path in the first circuit 11 and the second circuit 12 is turned on first, and then, the corresponding SCR current path is triggered to be turned on through a drainage effect, and due to a positive feedback effect inside the SCR current path, the first NPN transistor Q1, the first PNP transistor Q2, the second NPN transistor Q3 and the second PNP transistor Q4 can be quickly saturated and turned on, thereby realizing a lower trigger voltage and a faster start speed than the SCR structure alone.

Further, the first circuit 11 and the second circuit 12 according to this embodiment have small parasitic capacitance, which does not affect an operating state of the internal circuit, and sustaining voltages of the first circuit 11 and the second circuit 12 according to this embodiment may be greater than an operating voltage, thereby avoiding a latch-up effect, that is, preventing the disorder of circuit functions or direct failure of the circuit, so as to improve the reliability and stability of the electrostatic protection circuit.

In this embodiment, the first circuit 11 and the second circuit 12 are configured to protect the internal circuit jointly against the static electricity in the PS mode and the PD mode. Through the diode current path and the SCR current path arranged inside the first circuit 11, the SCR current path is further turned on by using the characteristics of the low trigger voltage of the diode current path and through the drainage effect of the diode current path, so as to provide a protection circuit with a low trigger voltage and a fast start speed against the static electricity in the PS mode and the PD mode.

Still referring to FIG. 2, a first resistor unit is connected between the base and the collector of the first NPN transistor Q1, and a second resistor unit is connected between the base and the collector of the second NPN transistor Q3. Specifically, the first resistor unit may include a resistor R1 and a resistor R2, and the second resistor unit may include a resistor R3 and a resistor R4. In this embodiment, the first resistor unit and the second resistor unit are provided, so that the first NPN transistor Q1 and the second NPN transistor Q3 can be accelerated into a saturation state, so as to increase a current discharge speed of the first circuit 11. Similarly, the second resistor unit may increase a current discharge speed of the second circuit 12. Therefore, the first circuit 11 and the second circuit 12 according to this embodiment further increase an ESD protection speed for the internal circuit.

Figure 3:
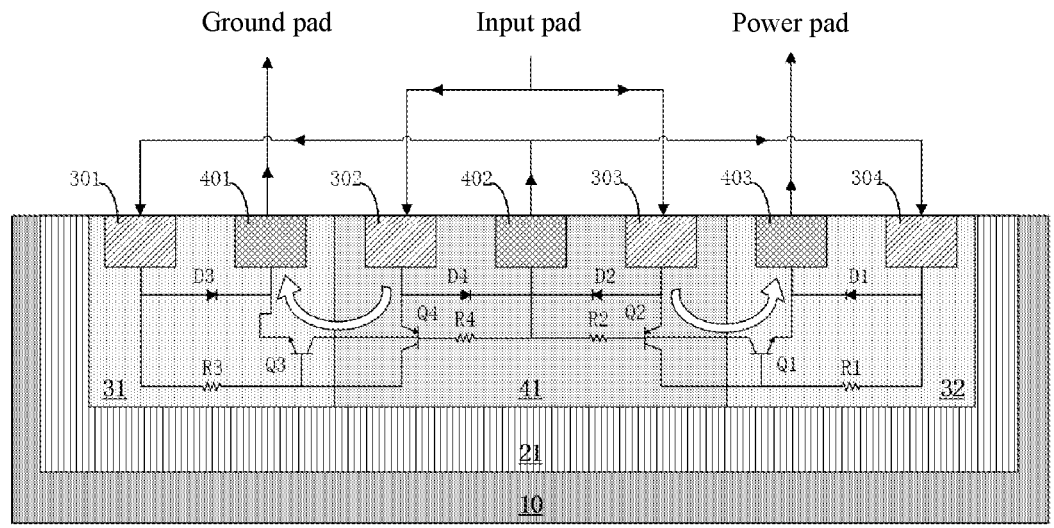
FIG. 3 is a schematic structural diagram of devices corresponding to the circuit diagram in the embodiment of FIG. 2.

FIG. 3 is a schematic structural diagram of devices corresponding to the circuit diagram in the embodiment of FIG. 2. In this embodiment, the power pad, the ground pad and the input pad are all located on a substrate (in order to more clearly describe current flow directions between the pads and the doped regions, the power pad, the ground pad and the input pad are not plotted on the substrate in FIG. 3), and the substrate is a P-type substrate.

As shown in FIG. 3, the substrate is provided with a first N-type deep well 21, and the first N-type deep well 21 is provided with a first P-type well 31, a first N-type well 41 and a second P-type well 32. The first P-type well 31 is provided with a first P-type heavily doped region 301 and a first N-type heavily doped region 401, and the first N-type heavily doped region 401 is electrically connected to the ground pad. The first N-type well 41 is provided with a second P-type heavily doped region 302, a second N-type heavily doped region 402 and a third P-type heavily doped region 303, the second N-type heavily doped region 402 is electrically connected to the first P-type heavily doped region 301, and the second P-type heavily doped region 302 and the third P-type heavily doped region 303 are both electrically connected to the input pad. The second P-type well 32 is provided with a third N-type heavily doped region 403 and a fourth P-type heavily doped region 304, the third N-type heavily doped region 403 is electrically connected to the power pad, and the fourth P-type heavily doped region 304 is electrically connected to the second N-type heavily doped region 402.

Specifically, the first N-type well 41, the second P-type well 32 and the third N-type heavily doped region 403 jointly form the first NPN transistor Q1. The third P-type heavily doped region 303, the first N-type well 41 and the second P-type well 32 jointly form the first PNP transistor Q2. The fourth P-type heavily doped region 304 and the third N-type heavily doped region 403 jointly form the first diode D1. The third P-type heavily doped region 303 and the second N-type heavily doped region 402 jointly form the second diode D2. The resistor R1 and the resistor R2 in the first resistor unit are formed between the first N-type well 41 and the second P-type well 32. The first N-type well 41, the first P-type well 31 and the second N-type heavily doped region 402 jointly form the second NPN transistor Q3. The second P-type heavily doped region 302, the first N-type well 41 and the first P-type well 31 jointly form the second PNP transistor Q4. The first P-type heavily doped region 301 and the first N-type heavily doped region 401 jointly form the third diode D3. The second P-type heavily doped region 302 and the second N-type heavily doped region 402 jointly form the fourth diode D4. The resistor R3 and the resistor R4 in the second resistor unit are formed between the first N-type well 41 and the first P-type well 31.

Further, in FIG. 3, the small black arrow shows the current flow direction of the diode current path, and the large white arrow shows the current flow direction of the SCR current path. When the static electricity in the PS mode or the PD mode is applied, the diode current path is first turned on between the input pad and the power pad; that is, the current flows from the input pad to the power pad along the third P-type heavily doped region 303, the second N-type heavily doped region 402, the fourth P-type heavily doped region 304 and the third N-type heavily doped region 403, so as to further trigger the turn-on of the SCR current path. That is, the electrostatic current is discharged through the first PNP transistor Q2 and the first NPN transistor Q1. Similarly, the diode current path is first turned on between the input pad and the ground pad; that is, the current flows from the input pad to the power pad along the second P-type heavily doped region 302, the second N-type heavily doped region 402, the first P-type heavily doped region 301 and the first N-type heavily doped region 401, so as to further trigger the turn-on of the SCR current path. That is, the electrostatic current is discharged through the second PNP transistor Q4 and the second NPN transistor Q3. Therefore, the electrostatic protection circuit according to this embodiment can prevent the electrostatic current from flowing through the internal circuit, thereby realizing the electrostatic protection for the internal circuit.

Figure 4:
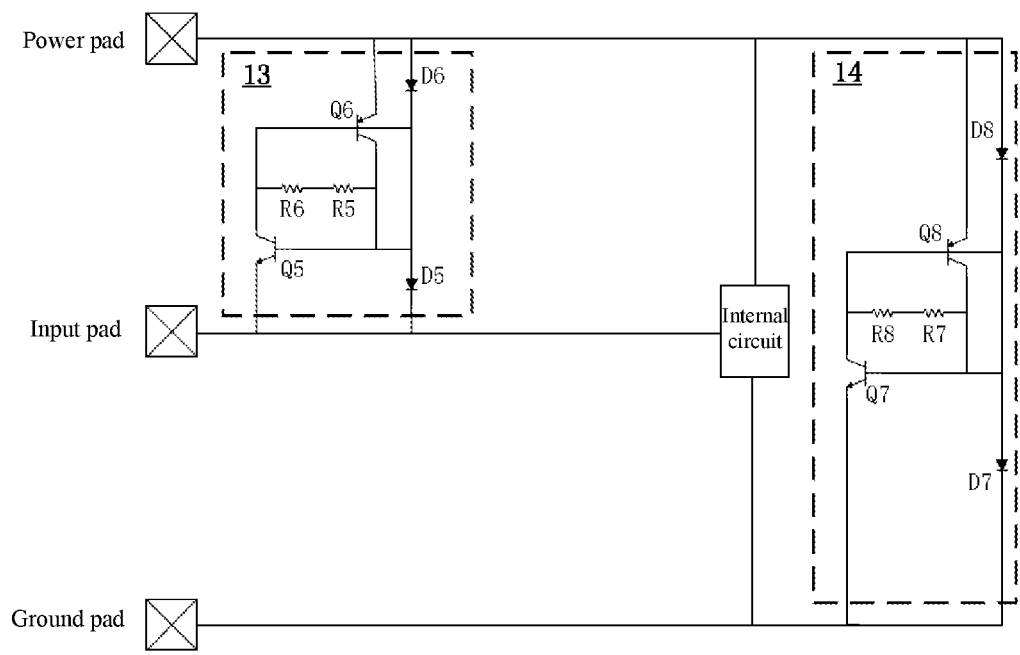
FIG. 4 is a circuit diagram of a protection circuit against static electricity in an ND mode according to an embodiment.

FIG. 4 is a circuit diagram of a protection circuit against static electricity in an ND mode according to an embodiment. As shown in FIG. 4, in this embodiment, the third circuit 13 and the fourth circuit 14 are configured to protect the internal circuit against the static electricity in the ND mode. The ND mode refers to an electrostatic discharge mode in which the electrostatic voltage is negative to the power supply voltage.

The third circuit 13 includes a third NPN transistor Q5 and a third PNP transistor Q6. An emitter of the third NPN transistor Q5 is connected to the input pad, a base of the third NPN transistor Q5 is connected to a collector of the third PNP transistor Q6, a collector of the third NPN transistor Q5 and a base of the third PNP transistor Q6, an emitter of the third PNP transistor Q6 is connected to the power pad, a fifth diode D5 is connected between the base and the emitter of the third NPN transistor Q5, and a sixth diode D6 is connected between the emitter and the base of the third PNP transistor Q6. The fifth diode D5 and the sixth diode D6 jointly form a diode current path, and the third NPN transistor Q5 and the third PNP transistor Q6 jointly form an SCR current path.

The fourth circuit 14 includes a fourth NPN transistor Q7 and a fourth PNP transistor Q8. An emitter of the fourth NPN transistor Q7 is connected to the ground pad, a base of the fourth NPN transistor Q7 is connected to a collector of the fourth PNP transistor Q8, a collector of the fourth NPN transistor Q7 and a base of the fourth PNP transistor Q8, an emitter of the fourth PNP transistor Q8 is connected to the power pad, a seventh diode D7 is connected between the base and the emitter of the fourth NPN transistor Q7, and an eighth diode D8 is connected between the emitter and the base of the fourth PNP transistor Q8. The seventh diode D7 and the eighth diode D8 jointly form a diode current path, and the fourth NPN transistor Q7 and the fourth PNP transistor Q8 jointly form an SCR current path.

Specifically, when no ESD happens, the power supply voltage is inputted to the input pad, the ground pad is connected to the ground, and the internal circuit operates normally. It may be understood that due to circuit characteristics of a diode structure and an SCR structure, an on-voltage of the diode current path is less than that of the SCR current path. Therefore, when ESD in the ND mode happens, the electrostatic voltage is negative to the power supply voltage, and in the circuit structure according to this embodiment, the diode current path in the third circuit 13 and the fourth circuit 14 is turned on first, and then, the corresponding SCR current path is triggered to be turned on through a drainage effect, and due to a positive feedback effect inside the SCR current path, the third NPN transistor Q5, the third PNP transistor Q6, the fourth NPN transistor Q7 and the fourth PNP transistor Q8 can be quickly saturated and turned on, thereby realizing a lower trigger voltage and a faster start speed than the SCR structure alone.

Further, the third circuit 13 and the fourth circuit 14 according to this embodiment have small parasitic capacitance, which does not affect an operating state of the internal circuit, and sustaining voltages of the third circuit 13 and the fourth circuit 14 according to this embodiment may be greater than an operating voltage, thereby avoiding a latch-up effect, that is, preventing the disorder of circuit functions or direct failure of the circuit, so as to improve the reliability and stability of the electrostatic protection circuit.

In this embodiment, the third circuit 13 and the fourth circuit 14 are configured to protect the internal circuit jointly against the static electricity in the ND mode. Through the diode current path and the SCR current path arranged inside the third circuit 13, the SCR current path is further turned on by using the characteristics of the low trigger voltage of the diode current path and through the drainage effect of the diode current path, so as to provide a protection circuit with a low trigger voltage and a fast start speed against the static electricity in the ND mode.

Still referring to FIG. 4, a third resistor unit is connected between the base and the collector of the third NPN transistor Q5, and a fourth resistor unit is connected between the base and the collector of the fourth NPN transistor Q7. Specifically, the third resistor unit may include a resistor R5 and a resistor R6, and the fourth resistor unit may include a resistor R7 and a resistor R8. In this embodiment, the third resistor unit and the fourth resistor unit are provided, so that the third NPN transistor Q5 and the fourth NPN transistor Q7 can be accelerated into a saturation state, so as to increase a current discharge speed of the third circuit 13. Similarly, the fourth resistor unit may increase a current discharge speed of the fourth circuit 14. Therefore, the third circuit 13 and the fourth circuit 14 according to this embodiment further increase an ESD protection speed for the internal circuit.

Figure 5:
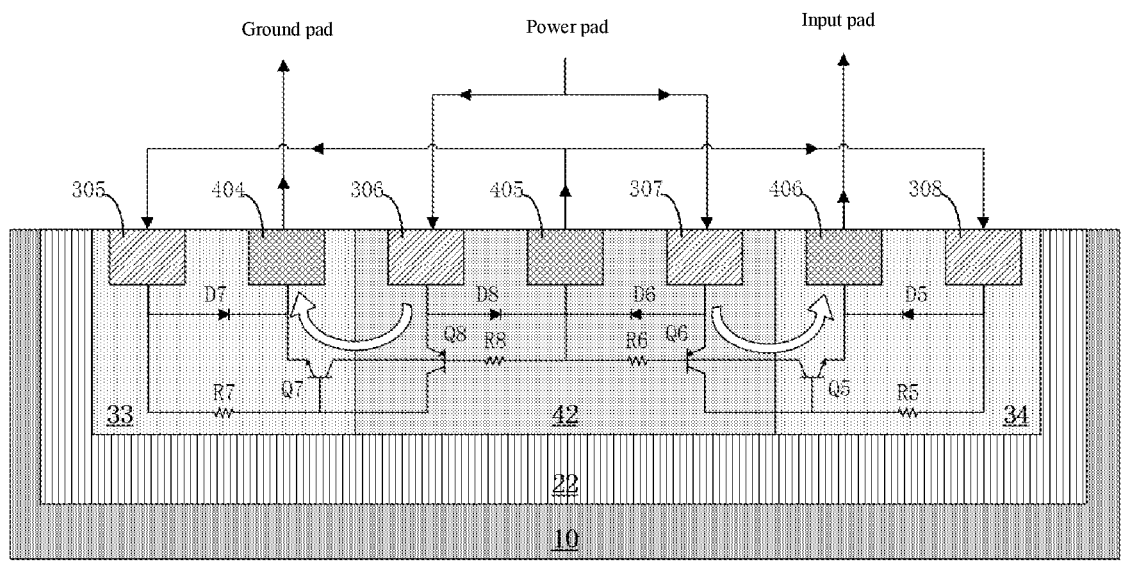
FIG. 5 is a schematic structural diagram of devices corresponding to the circuit diagram in the embodiment of FIG. 4.

FIG. 5 is a schematic structural diagram of devices corresponding to the circuit diagram in the embodiment of FIG. 4. In this embodiment, the power pad, the ground pad and the input pad are all located on a substrate (in order to more clearly describe current flow directions between the pads and the doped regions, the power pad, the ground pad and the input pad are not plotted on the substrate in FIG. 5), and the substrate is a P-type substrate. As shown in FIG. 5, the substrate is provided with a second N-type deep well 22, and the second N-type deep well 22 is provided with a third P-type well 33, a second N-type well 42 and a fourth P-type well 34. The third P-type well 33 is provided with a fifth P-type heavily doped region 305 and a fourth N-type heavily doped region 404, and the fourth N-type heavily doped region 404 is electrically connected to the ground pad. The second N-type well 42 is provided with a sixth P-type heavily doped region 306, a fifth N-type heavily doped region 405 and a seventh P-type heavily doped region 307, the fifth N-type heavily doped region 405 is electrically connected to the fifth P-type heavily doped region 305, and the sixth P-type heavily doped region 306 and the seventh P-type heavily doped region 307 are both electrically connected to the power pad. The fourth P-type well 34 is provided with a sixth N-type heavily doped region 406 and an eighth P-type heavily doped region 308, the sixth N-type heavily doped region 406 is electrically connected to the input pad, and the eighth P-type heavily doped region 308 is electrically connected to the fifth N-type heavily doped region 405.

Specifically, the second N-type well 42, the fourth P-type well 34 and the sixth N-type heavily doped region 406 jointly form the third NPN transistor Q5. The seventh P-type heavily doped region 307, the second N-type well 42 and the fourth P-type well 34 jointly form the third PNP transistor Q6. The eighth P-type heavily doped region 308 and the sixth N-type heavily doped region 406 jointly form the fifth diode D5. The seventh P-type heavily doped region 307 and the fifth N-type heavily doped region 405 jointly form the sixth diode D6. The resistor R5 and the resistor R6 in the third resistor unit are formed between the second N-type well 42 and the fourth P-type well 34. The second N-type well 42, the third P-type well 33 and the fourth N-type heavily doped region 404 jointly form the fourth NPN transistor Q7. The sixth P-type heavily doped region 306, the second N-type well 42 and the third P-type well 33 jointly form the fourth PNP transistor Q8. The fifth P-type heavily doped region 305 and the fourth N-type heavily doped region 404 jointly form the seventh diode D7. The sixth P-type heavily doped region 306 and the fifth N-type heavily doped region 405 jointly form the eighth diode D8. The resistor R7 and the resistor R8 in the fourth resistor unit are formed between the second N-type well 42 and the third P-type well 33.

Further, in FIG. 5, the small black arrow shows the current flow direction of the diode current path, and the large white arrow shows the current flow direction of the SCR current path. When the static electricity in the ND mode is applied, the diode current path is first turned on between the power pad and the input pad; that is, the current flows from the power pad to the input pad along the seventh P-type heavily doped region 307, the fifth N-type heavily doped region 405, the eighth P-type heavily doped region 308 and the sixth N-type heavily doped region 406, so as to further trigger the turn-on of the SCR current path. That is, the electrostatic current is discharged through the third PNP transistor Q6 and the third NPN transistor Q5. Similarly, the diode current path is first turned on between the power pad and the ground pad; that is, the current flows from the power pad to the input pad along the sixth P-type heavily doped region 306, the fifth N-type heavily doped region 405, the fifth P-type heavily doped region 305 and the fourth N-type heavily doped region 404, so as to further trigger the turn-on of the SCR current path. That is, the electrostatic current is discharged through the eighth PNP transistor and the seventh NPN transistor. Therefore, the electrostatic protection circuit according to this embodiment can prevent the electrostatic current from flowing through the internal circuit, thereby realizing the electrostatic protection for the internal circuit.

Figure 6:
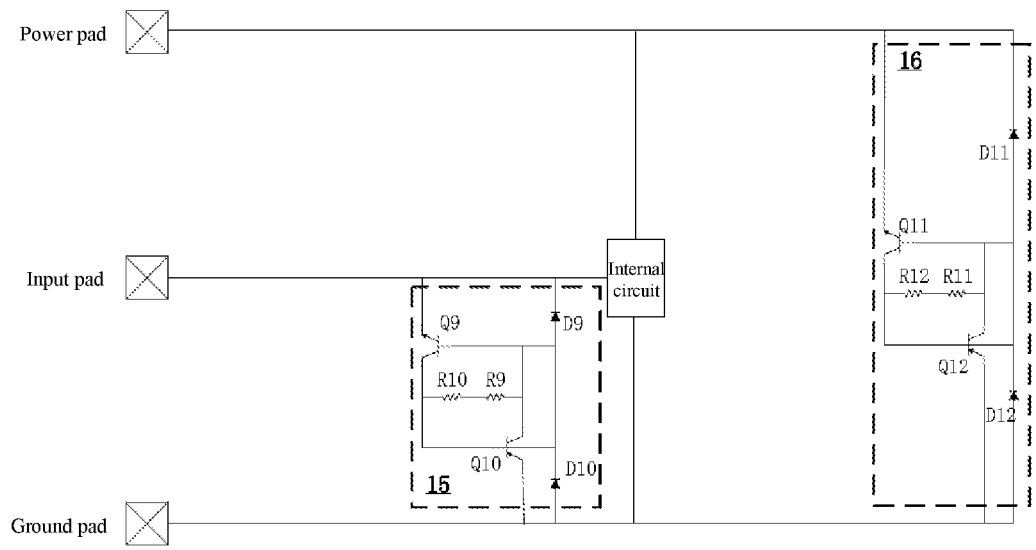
FIG. 6 is a circuit diagram of a protection circuit against static electricity in an NS mode according to an embodiment.

FIG. 6 is a circuit diagram of a protection circuit against static electricity in an NS mode according to an embodiment. As shown in FIG. 6, in this embodiment, the fifth circuit 15 and the seventh circuit 16 are configured to protect the internal circuit against the static electricity in the NS mode. The NS mode refers to an electrostatic discharge mode in which the electrostatic voltage is negative to the power supply voltage.

The fifth circuit 15 includes a fifth NPN transistor Q9 and a fifth PNP transistor Q10. An emitter of the fifth NPN transistor Q9 is connected to the input pad, a base of the fifth NPN transistor Q9 is connected to a collector of the fifth PNP transistor Q10, a collector of the fifth NPN transistor Q9 and a base of the fifth PNP transistor Q10, an emitter of the fifth PNP transistor Q10 is connected to the ground pad, a ninth diode D9 is connected between the base and the emitter of the fifth NPN transistor Q9, and a tenth diode D10 is connected between the emitter and the base of the fifth PNP transistor Q10. The ninth diode D9 and the tenth diode D10 jointly form a diode current path, and the fifth NPN transistor Q9 and the fifth PNP transistor Q10 jointly form an SCR current path.

The sixth circuit 16 includes a sixth NPN transistor Q11 and a sixth PNP transistor Q12. An emitter of the sixth NPN transistor Q11 is connected to the power pad, a base of the sixth NPN transistor Q11 is connected to a collector of the sixth PNP transistor Q12, a collector of the sixth NPN transistor Q11 and a base of the sixth PNP transistor Q12, an emitter of the sixth PNP transistor Q12 is connected to the ground pad, an eleventh diode D11 is connected between the base and the emitter of the sixth NPN transistor Q11, and a twelfth diode D12 is connected between the emitter and the base of the sixth PNP transistor Q12. The eleventh diode D11 and the twelfth diode D12 jointly form a diode current path, and the sixth NPN transistor Q11 and the sixth PNP transistor Q12 jointly form an SCR current path.

Specifically, when no ESD happens, the power supply voltage is inputted to the input pad, the power pad is connected to the ground, and the internal circuit operates normally. It may be understood that due to circuit characteristics of a diode structure and an SCR structure, an on-voltage of the diode current path is less than that of the SCR current path. Therefore, when ESD in the NS mode happens, the electrostatic voltage is negative to the ground voltage, and in the circuit structure according to this embodiment, the diode current path in the fifth circuit 15 and the sixth circuit 16 may be turned on first, and then, the corresponding SCR current path is triggered to be turned on through a drainage effect, and due to a positive feedback effect inside the SCR current path, the fifth NPN transistor Q9, the fifth PNP transistor Q10, the sixth NPN transistor Q11 and the sixth PNP transistor Q12 can be quickly saturated and turned on, thereby realizing a lower trigger voltage and a faster start speed than the SCR structure alone.

Further, the fifth circuit 15 and the sixth circuit 16 according to this embodiment have small parasitic capacitance, which does not affect an operating state of the internal circuit, and sustaining voltages of the fifth circuit 15 and the sixth circuit 16 according to this embodiment may be greater than an operating voltage, thereby avoiding a latch-up effect, that is, preventing the disorder of circuit functions or direct failure of the circuit, so as to improve the reliability and stability of the electrostatic protection circuit.

In this embodiment, the fifth circuit 15 and the sixth circuit 16 are configured to protect the internal circuit jointly against the static electricity in the NS mode. Through the diode current path and the SCR current path arranged inside the fifth circuit 15, the SCR current path is further turned on by using the characteristics of the low trigger voltage of the diode current path and through the drainage effect of the diode current path, so as to provide a protection circuit with a low trigger voltage and a fast start speed against the static electricity in the NS mode.

Still referring to FIG. 6, a fifth resistor unit is connected between the base and the collector of the fifth NPN transistor Q9, and a sixth resistor unit is connected between the base and the collector of the sixth NPN transistor Q11. Specifically, the fifth resistor unit may include a resistor R9 and a resistor R10, and the sixth resistor unit may include a resistor R11 and a resistor R12. In this embodiment, the fifth resistor unit and the sixth resistor unit are provided, so that the fifth NPN transistor Q9 and the sixth NPN transistor Q11 can be accelerated into a saturation state, so as to increase a current discharge speed of the fifth circuit 15. Similarly, the sixth resistor unit may increase a current discharge speed of the sixth circuit 16. Therefore, the fifth circuit 15 and the sixth circuit 16 according to this embodiment further increase an ESD protection speed for the internal circuit.

Figure 7:
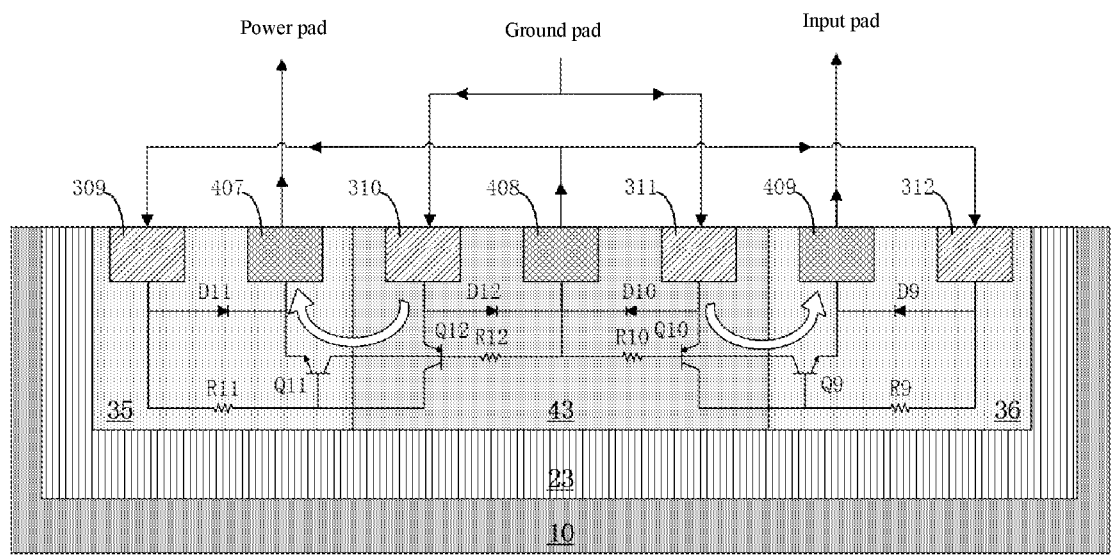
FIG. 7 is a schematic structural diagram of devices corresponding to the circuit diagram in the embodiment of FIG. 6.

FIG. 7 is a schematic structural diagram of devices corresponding to the circuit diagram in the embodiment of FIG. 6. In this embodiment, the power pad, the ground pad and the input pad are all located on a substrate (in order to more clearly describe current flow directions between the pads and the doped regions, the power pad, the ground pad and the input pad are not plotted on the substrate in FIG. 7), and the substrate is a P-type substrate. As shown in FIG. 7, the substrate is provided with a third N-type deep well 23, and the third N-type deep well 23 is provided with a fifth P-type well 35, a third N-type well 43 and a sixth P-type well 36. The fifth P-type well 35 is provided with a ninth P-type heavily doped region 309 and a seventh N-type heavily doped region 407, and the seventh N-type heavily doped region 407 is electrically connected to the power pad. The third N-type well 43 is provided with a tenth P-type heavily doped region 310, an eighth N-type heavily doped region 408 and an eleventh P-type heavily doped region 311, the eighth N-type heavily doped region 408 is electrically connected to the ninth P-type heavily doped region 309, and the tenth P-type heavily doped region 310 and the eleventh P-type heavily doped region 311 are both electrically connected to the ground pad. The sixth P-type well 36 is provided with a ninth N-type heavily doped region 409 and a twelfth P-type heavily doped region 312, the ninth N-type heavily doped region 409 is electrically connected to the input pad, and the twelfth P-type heavily doped region 312 is electrically connected to the eighth N-type heavily doped region 408.

Specifically, the third N-type well 43, the sixth P-type well 36 and the ninth N-type heavily doped region 409 jointly form the fifth NPN transistor Q9, and the eleventh P-type heavily doped region 311, the third N-type well 43 and the sixth P-type well 36 jointly form the fifth PNP transistor Q10. The twelfth P-type heavily doped region 312 and the ninth N-type heavily doped region 409 jointly form the ninth diode D9. The eleventh P-type heavily doped region 311 and the eighth N-type heavily doped region 408 jointly form the tenth diode D10. The resistor R9 and the resistor R10 in the fifth resistor unit are formed between the third N-type well 43 and the sixth P-type well 36. The third N-type well 43, the fifth P-type well 35 and the seventh N-type heavily doped region 407 jointly form the sixth NPN transistor Q11, and the tenth P-type heavily doped region 310, the third N-type well 43 and the fifth P-type well 35 jointly form the sixth PNP transistor Q12. The ninth P-type heavily doped region 309 and the seventh N-type heavily doped region 407 jointly form the eleventh diode D11. The tenth P-type heavily doped region 310 and the eighth N-type heavily doped region 408 jointly form the twelfth diode D12. The resistor R11 and the resistor R12 in the sixth resistor unit are formed between the third N-type well 43 and the fifth P-type well 35.

Further, in FIG. 7, the small black arrow shows the current flow direction of the diode current path, and the large white arrow shows the current flow direction of the SCR current path. When the static electricity in the NS mode is applied, the diode current path is first turned on between the ground pad and the input pad; that is, the current flows from the ground pad to the input pad along the eleventh P-type heavily doped region 311, the eighth N-type heavily doped region 408, the twelfth P-type heavily doped region 312 and the ninth N-type heavily doped region 409, so as to further trigger the turn-on of the SCR current path. That is, the electrostatic current is discharged through the fifth PNP transistor Q10 and the fifth NPN transistor Q9. Similarly, the diode current path is first turned on between the ground pad and the power pad; that is, the current flows from the ground pad to the input pad along the tenth P-type heavily doped region 310, the eighth N-type heavily doped region 408, the ninth P-type heavily doped region 309 and the seventh N-type heavily doped region 407, so as to further trigger the turn-on of the SCR current path. That is, the electrostatic current is discharged through the sixth PNP transistor Q12 and the sixth NPN transistor Q11. Therefore, the electrostatic protection circuit according to this embodiment can prevent the electrostatic current from flowing through the internal circuit, thereby realizing the electrostatic protection for the internal circuit.

Figure 8:
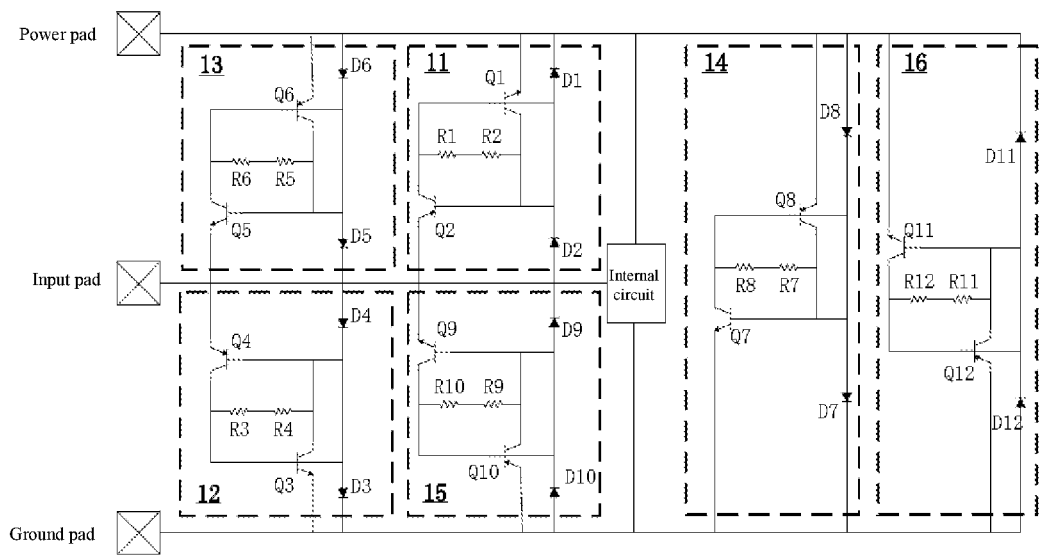
FIG. 8 is a circuit diagram of a full-mode electrostatic protection circuit according to an embodiment.

FIG. 8 is a circuit diagram of a full-mode electrostatic protection circuit according to an embodiment. As shown in FIG. 8, in this embodiment, the electrostatic protection circuit includes a first circuit 11, a second circuit 12, a third circuit 13, a fourth circuit 14, a fifth circuit 15 and a sixth circuit 16, and each circuit includes the diode current path and the SCR current path described above. The first circuit 11 and the second circuit 12 jointly provide protection against static electricity in a PS mode and a PD mode, the third circuit 13 and the fourth circuit 14 jointly provide protection against static electricity in an ND mode, and the fifth circuit 15 and the sixth circuit 16 jointly provide protection against static electricity in an NS mode, so as to realize a full-mode, all-chip electrostatic protection circuit with a low trigger voltage and a fast start speed.

Further, the PS mode, the PD mode, the NS mode and the ND mode are all sub-modes of a human-body model (HBM) mode, i.e., an electrostatic discharge mode in which a device is discharged by a charged human body. In addition to the HBM mode, the electrostatic protection circuit according to this embodiment may also be configured to protect against static electricity in a charged device model (CDM) mode. The CDM mode is an electrostatic discharge mode in which a charged device directly discharges to the ground. The electrostatic protection circuit according to this embodiment performs protection against the static electricity in the CDM mode, so as to further improve the electrostatic protection capability and reliability of semiconductor devices.

In the description of the specification, reference terms such as "some embodiments", "other embodiments", and "ideal examples" mean that a particular feature, structure, material, or characteristic described in connection with the embodiment or example is included in at least one embodiment or example of the present invention. In the specification, the schematic expressions to the above terms are not necessarily referring to the same embodiment or example.

Technical features of the above embodiments may be combined randomly. To make descriptions brief, not all possible combinations of the technical features in the embodiments are described. However, as long as there is no contradiction between the combinations of the technical features, they should all be considered as scopes disclosed in the specification.

The above embodiments only describe several implementations of the present application, and their description is specific and detailed, but cannot therefore be understood as a limitation on the patent scope of the present application. It should be noted that those of ordinary skill in the art may further make variations and improvements without departing from the conception of the present application, and these all fall within the protection scope of the present application. Therefore, the patent protection scope of the present application should be subject to the appended claims.

What is claimed is:

1. An electrostatic protection circuit for protecting an internal circuit, the electrostatic protection circuit comprising:
   a first circuit connected between a power pad and an input pad and configured to discharge a first electrostatic current, the first electrostatic current flowing from the input pad to the power pad; and
   a second circuit connected between the input pad and a ground pad and configured to discharge a second electrostatic current, the second electrostatic current flowing from the input pad to the ground pad;
   wherein the ground pad and the power pad are both located on a substrate, the substrate being a P-type substrate, the substrate being provided with a first N-type deep well, and the first N-type deep well being provided with a first P-type well, a first N-type well and a second P-type well, wherein
   the first P-type well is provided with a first P-type heavily doped region and a first N-type heavily doped region, the first N-type heavily doped region being electrically connected to the ground pad;
   the first N-type well is provided with a second P-type heavily doped region, a second N-type heavily doped region and a third P-type heavily doped region, the second N-type heavily doped region being electrically connected to the first P-type heavily doped region, and the second P-type heavily doped region and the third P-type heavily doped region being both electrically connected to the input pad; and the second P-type well is provided with a third N-type heavily doped region and a fourth P-type heavily doped region, the third N-type heavily doped region being electrically connected to the power pad, and the fourth P-type heavily doped region being electrically connected to the second N-type heavily doped region.

2. The electrostatic protection circuit according to claim 1, wherein the first circuit comprises a first NPN transistor and a first PNP transistor, the first N-type well, the second P-type well and the third N-type heavily doped region jointly form the first NPN transistor, and the third P-type heavily doped region, the first N-type well and the second P-type well jointly form the first PNP transistor, wherein an emitter of the first NPN transistor is connected to the power pad; a base of the first NPN transistor is connected to a collector of the first PNP transistor, a collector of the first NPN transistor and a base of the first PNP transistor; an emitter of the first PNP transistor is connected to the input pad; a first diode is connected between the base and the emitter of the first NPN transistor, and a second diode is connected between the emitter and the base of the first PNP transistor, wherein the fourth P-type heavily doped region and the third N-type heavily doped region jointly form the first diode, and the third P-type heavily doped region and the second N-type heavily doped region jointly form the second diode; and the second circuit comprises a second NPN transistor and a second PNP transistor, the first N-type well, the first P-type well and the second N-type heavily doped region jointly form the second NPN transistor, and the second P-type heavily doped region, the first N-type well and the first P-type well jointly form the second PNP transistor, wherein an emitter of the second NPN transistor is connected to the ground pad; a base of the second NPN transistor is connected to a collector of the second PNP transistor, a collector of the second NPN transistor and a base of the second PNP transistor; an emitter of the second PNP transistor is connected to the input pad; a third diode is connected between the base and the emitter of the second NPN transistor; and a fourth diode is connected between the emitter and the base of the second PNP transistor, wherein the first P-type heavily doped region and the first N-type heavily doped region jointly form the third diode, and the second P-type heavily doped region and the second N-type heavily doped region jointly form the fourth diode.

3. The electrostatic protection circuit according to claim 2, wherein a first resistor unit is connected between the base and the collector of the first NPN transistor, resistors in the first resistor unit are formed between the first N-type well and the second P-type well, a second resistor unit is connected between the base and the collector of the second NPN transistor, and resistors in the second resistor unit are formed between the first N-type well and the first P-type well.

4. An electrostatic protection circuit for protecting an internal circuit, the electrostatic protection circuit comprising:

a third circuit connected between a power pad and an input pad and configured to discharge a third electrostatic current, the third electrostatic current flowing from the power pad to the input pad; and a fourth circuit connected between the power pad and a ground pad and configured to discharge a fourth electrostatic current, the fourth electrostatic current flowing from the power pad to the ground pad;

wherein the ground pad and the input pad are both located on a substrate, the substrate being a P-type substrate, the substrate being provided with a second N-type deep well, and the second N-type deep well being provided with a third P-type well, a second N-type well and a fourth P-type well, wherein the third P-type well is provided with a fifth P-type heavily doped region and a fourth N-type heavily doped region, the fourth N-type heavily doped region being electrically connected to the ground pad;

the second N-type well is provided with a sixth P-type heavily doped region, a fifth N-type heavily doped region and a seventh P-type heavily doped region, the fifth N-type heavily doped region being electrically connected to the fifth P-type heavily doped region, and the sixth P-type heavily doped region and the seventh P-type heavily doped region being both electrically connected to the power pad; and the fourth P-type well is provided with a sixth N-type heavily doped region and an eighth P-type heavily doped region, the sixth N-type heavily doped region being electrically connected to the input pad, and the eighth P-type heavily doped region being electrically connected to the fifth N-type heavily doped region.

5. The electrostatic protection circuit according to claim 4, wherein the third circuit comprises a third NPN transistor and a third PNP transistor, the second N-type well, the fourth P-type well and the sixth N-type heavily doped region jointly form the third NPN transistor, the seventh P-type heavily doped region, the second N-type well and the fourth P-type well jointly form the third PNP transistor, wherein an emitter of the third NPN transistor is connected to the input pad; a base of the third NPN transistor is connected to a collector of the third PNP transistor, a collector of the third NPN transistor and a base of the third PNP transistor; an emitter of the third PNP transistor is connected to the power pad; a fifth diode is connected between the base and the emitter of the third NPN transistor; and a sixth diode is connected between the emitter and the base of the third PNP transistor, the eighth P-type heavily doped region and the sixth N-type heavily doped region jointly form the fifth diode, and the seventh P-type heavily doped region and the fifth N-type heavily doped region jointly form the sixth diode; and the fourth circuit comprises a fourth NPN transistor and a fourth PNP transistor, the second N-type well, the third P-type well and the fourth N-type heavily doped region jointly form the fourth NPN transistor, and the sixth P-type heavily doped region, the second N-type well and the third P-type well jointly form the fourth PNP transistor, wherein an emitter of the fourth NPN transistor is connected to the ground pad; a base of the fourth NPN transistor is connected to a collector of the fourth PNP transistor, a collector of the fourth NPN transistor and a base of the fourth PNP transistor; an emitter of the fourth PNP transistor is connected to the power pad; a seventh diode is connected between the base and the emitter of the fourth NPN transistor; and an eighth diode is connected between the emitter and the base of the fourth PNP transistor, wherein the fifth P-type heavily doped region and the fourth N-type heavily doped region jointly form the seventh diode, the sixth P-type heavily doped region and the fifth N-type heavily doped region jointly form the eighth diode.

6. The electrostatic protection circuit according to claim 5, wherein a third resistor unit is connected between the base and the collector of the third NPN transistor, resistors in the third resistor unit are formed between the second N-type well and the fourth P-type well, a fourth resistor unit is connected between the base and the collector of the fourth NPN transistor, and resistors in the fourth resistor unit are formed between the second N-type well and the third P-type well.

7. An electrostatic protection circuit for protecting an internal circuit, the electrostatic protection circuit comprising:
- a fifth circuit connected between an input pad and a ground pad and configured to discharge a fifth electrostatic current, the fifth electrostatic current flowing from the ground pad to the input pad; and
- a sixth circuit connected between the ground pad and a power pad and configured to discharge a sixth electrostatic current, the sixth electrostatic current flowing from the ground pad to the power pad;
- wherein the power pad and the input pad are both located on a substrate, the substrate being a P-type substrate, the substrate being provided with a third N-type deep well, and the third N-type deep well being provided with a fifth P-type well, a third N-type well and a sixth P-type well, wherein
- the fifth P-type well is provided with a ninth P-type heavily doped region and a seventh N-type heavily doped region, the seventh N-type heavily doped region being electrically connected to the power pad;
- the third N-type well is provided with a tenth P-type heavily doped region, an eighth N-type heavily doped region and an eleventh P-type heavily doped region, the eighth N-type heavily doped region being electrically connected to the ninth P-type heavily doped region, and the tenth P-type heavily doped region and the eleventh P-type heavily doped region being both electrically connected to the ground pad; and
- the sixth P-type well is provided with a ninth N-type heavily doped region and a twelfth P-type heavily doped region, the ninth N-type heavily doped region being electrically connected to the input pad, and the twelfth P-type heavily doped region being electrically connected to the eighth N-type heavily doped region.

8. The electrostatic protection circuit according to claim 7, wherein the fifth circuit comprises a fifth NPN transistor and a fifth PNP transistor, the third N-type well, the sixth P-type well and the ninth N-type heavily doped region jointly form the fifth NPN transistor, and the eleventh P-type heavily doped region, the third N-type well and the sixth P-type well jointly form the fifth PNP transistor, wherein an emitter of the fifth NPN transistor is connected to the input pad; a base of the fifth NPN transistor is connected to a collector of the fifth PNP transistor, a collector of the fifth NPN transistor and a base of the fifth PNP transistor; an emitter of the fifth PNP transistor is connected to the ground pad; a ninth diode is connected between the base and the emitter of the fifth NPN transistor; and a tenth diode is connected between the emitter and the base of the fifth PNP transistor, wherein the twelfth P-type heavily doped region and the ninth N-type heavily doped region jointly form the ninth diode, and the eleventh P-type heavily doped region and the eighth N-type heavily doped region jointly form the tenth diode; and the sixth circuit comprises a sixth NPN transistor and a sixth PNP transistor, the third N-type well, the fifth P-type well and the seventh N-type heavily doped region jointly form the sixth NPN transistor, and the tenth P-type heavily doped region, the third N-type well and the fifth P-type well jointly form the sixth PNP transistor, wherein an emitter of the sixth NPN transistor is connected to the power pad; a base of the sixth NPN transistor is connected to a collector of the sixth PNP transistor, a collector of the sixth NPN transistor and a base of the sixth PNP transistor; an emitter of the sixth PNP transistor is connected to the ground pad; an eleventh diode is connected between the base and the emitter of the sixth NPN transistor, and a twelfth diode is connected between the emitter and the base of the sixth PNP transistor, wherein the ninth P-type heavily doped region and the seventh N-type heavily doped region jointly form the eleventh diode, and the tenth P-type heavily doped region and the eighth N-type heavily doped region jointly form the twelfth diode.

9. The electrostatic protection circuit according to claim 8, wherein a fifth resistor unit is connected between the base and the collector of the fifth NPN transistor, resistors in the fifth resistor unit are formed between the third N-type well and the sixth P-type well, a sixth resistor unit is connected between the base and the collector of the sixth NPN transistor, and resistors in the sixth resistor unit are formed between the third N-type well and the fifth P-type well.

* * * * *